(12) United States Patent
Dogiamis et al.

(10) Patent No.: US 11,538,758 B2
(45) Date of Patent: Dec. 27, 2022

(54) WAVEGUIDE INTERCONNECT BRIDGES

(71) Applicant: Intel Corporation, Santa Clara, CA (US)

(72) Inventors: Georgios Dogiamis, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 1099 days.

(21) Appl. No.: 15/963,066

(22) Filed: Apr. 25, 2018

(65) Prior Publication Data

US 2019/0287908 A1    Sep. 19, 2019

(30) Foreign Application Priority Data

Mar. 19, 2018 (GR) ............................... 20180100115

(51) Int. Cl.
| | | |
|---|---|---|
| *H01L 23/538* | (2006.01) | |
| *H01L 25/065* | (2006.01) | |
| *H01L 23/66* | (2006.01) | |
| *H01P 3/12* | (2006.01) | |
| *H01P 5/12* | (2006.01) | |

(52) U.S. Cl.
CPC .......... *H01L 23/5381* (2013.01); *H01L 23/66* (2013.01); *H01L 25/0655* (2013.01); *H01P 3/12* (2013.01); *H01P 3/121* (2013.01); *H01P 5/12* (2013.01); *H01L 2223/6627* (2013.01)

(58) Field of Classification Search
CPC ... H01P 3/12; H01P 3/121; H01P 5/12; G02B 6/12; G02B 6/36; H01L 23/5381; H01L 23/66; H01L 25/0655; H01L 2223/6627

USPC ............................................................ 333/1
See application file for complete search history.

(56) References Cited

U.S. PATENT DOCUMENTS

| | | | | |
|---|---|---|---|---|
| 5,311,604 A | * | 5/1994 | Rogner ................ | G02B 6/1221 264/1.36 |
| 7,150,569 B2 | * | 12/2006 | Oono .................. | G02B 6/4206 385/88 |
| 7,333,682 B2 | * | 2/2008 | Kobayashi ......... | G02B 6/12004 385/14 |
| 7,945,127 B2 | * | 5/2011 | Lu ............................ | G02B 6/43 385/14 |
| 8,157,456 B2 | * | 4/2012 | Wang .................. | H01L 25/167 385/88 |

FOREIGN PATENT DOCUMENTS

WO    WO-2018024991 A1 * 2/2018 ............. G01N 21/01

OTHER PUBLICATIONS

The FOA Reference Guide For FiberOptics—Optical Fiber by the Fiber Optic Association (FOA), Inc., p. 1-13, (C)1999-2018, The Fiber Optic Association, Inc. (Year: 2018).*

(Continued)

*Primary Examiner* — Hafizur Rahman
(74) *Attorney, Agent, or Firm* — Schwabe, Williamson & Wyatt P.C.

(57) ABSTRACT

Disclosed herein are waveguide interconnect bridges for integrated circuit (IC) structures, as well as related methods and devices. In some embodiments, a waveguide interconnect bridge may include a waveguide material and one or more wall cavities in the waveguide material. The waveguide interconnect bridge may communicatively couple two dies in an IC package.

17 Claims, 7 Drawing Sheets

(56) References Cited

OTHER PUBLICATIONS

Dolatsha, Nemat, et al., "Dielectric Waveguide with Planar Multi-Mode Excitation for High Data-Rate Chip-to-Chip Interconnects," 2013 IEEE International Conference on Ultra-Wideband (ICUWB), Sep. 2013, Sydney, Australia; 5 pages.

Yu, Bo, et al., "Dielectric Waveguide Based Multi-Mode sub-THz Interconnect Channel for High Data-Rate High Bandwidth-Density Planar Chip-to-Chip Communications," University of California, Davis, US, Apr. 2017; 3 pages.

* cited by examiner

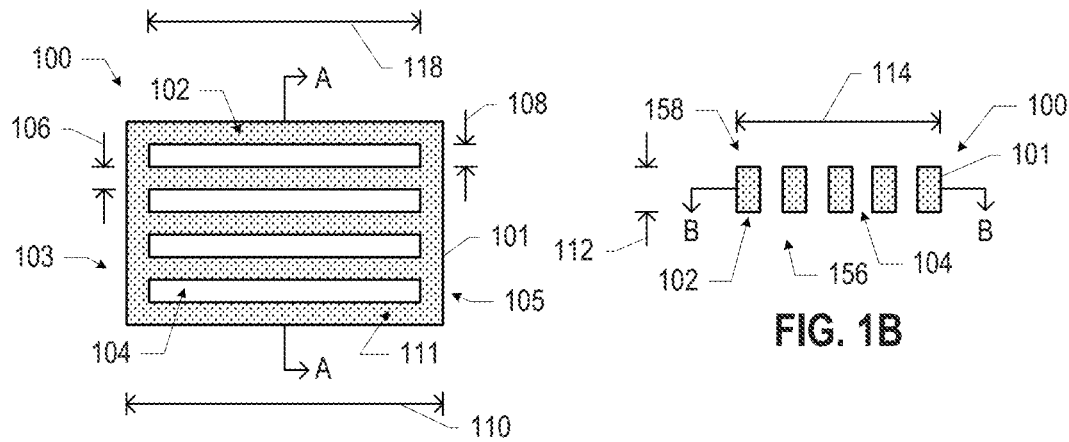
FIG. 1A
FIG. 1B
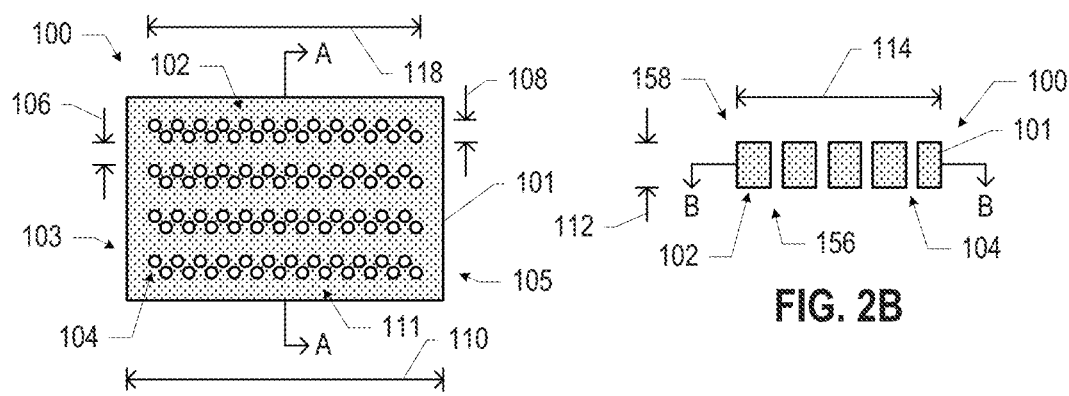
FIG. 2A
FIG. 2B
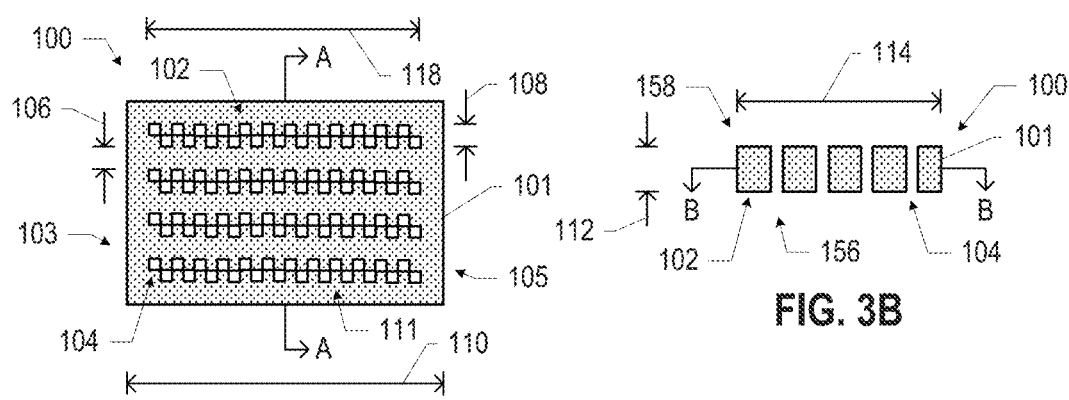
FIG. 3A
FIG. 3B

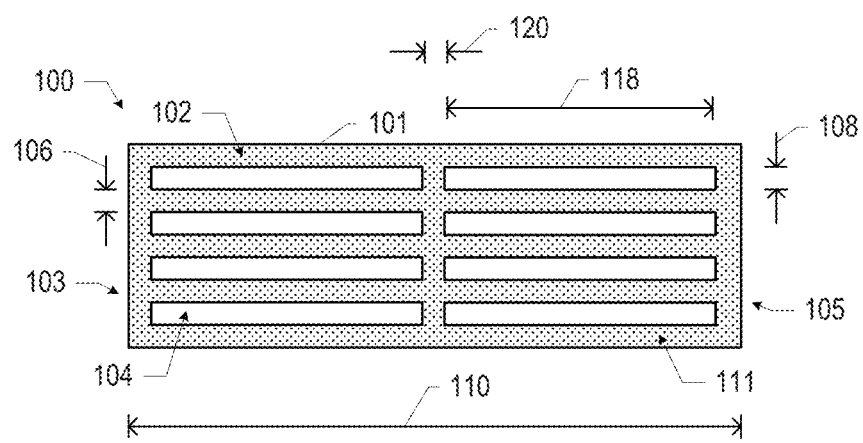
FIG. 4
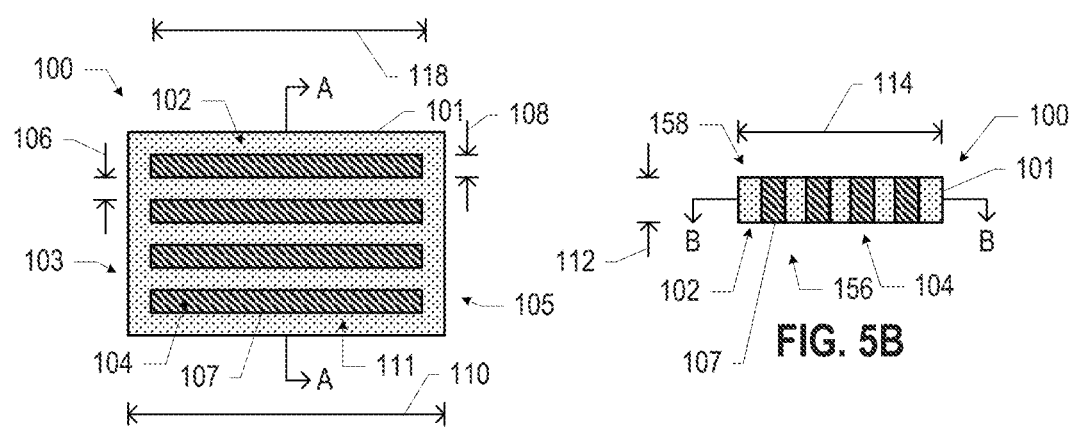
FIG. 5A
FIG. 5B

WAVEGUIDE INTERCONNECT BRIDGES

CROSS-REFERENCE TO RELATED APPLICATION

This application claims priority to Greek Patent Application No. 20180100115, filed Mar. 19, 2018 and titled "WAVEGUIDE INTERCONNECT BRIDGES," the contents of which are incorporated in their entirety herein.

BACKGROUND

Multiple elements in an integrated circuit (IC) structure may be electrically connected by transmission lines. Examples of transmission lines may include microstrips and striplines.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1B, 2A-2B, 3A-3B, 4, and 5A-5B are cross-sectional views of examples of waveguide interconnect bridges, in accordance with various embodiments.

DETAILED DESCRIPTION

Figure 6A:
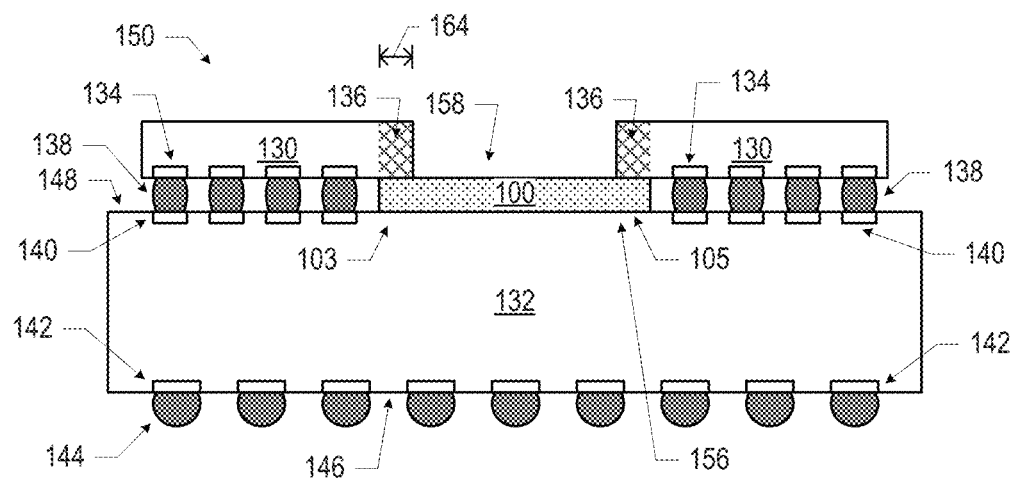
FIGS. 6A-6B and 7-10 are views of examples of waveguide interconnect bridge packages, in accordance with various embodiments.

Disclosed herein are waveguide interconnect bridges for integrated circuit (IC) structures, as well as related methods and devices. In some embodiments, a waveguide interconnect bridge may include a waveguide material and one or more wall cavities in the waveguide material. The waveguide interconnect bridge may communicatively couple two dies in an IC package.

Some conventional IC packages include multiple dies that communicate with each other using on-package transmission lines. Such transmission lines may include microstrips or striplines. When increased communication density or capacity is desired in such IC packages, these transmission lines may be routed more closely, and/or their number may be increased. However, routing such transmission lines too close together may result in significant signal coupling ("cross talk") between the lines, degrading the quality of performance. Increasing the number of transmission lines in an IC package, while maintaining a large enough spacing between them, may require a large X-Y footprint for the package substrate and/or a large number of layers in the package substrate (with an attendant large Z-height). Further, such transmission lines may have a non-constant insertion loss when high-frequency signals are transmitted along the lines, resulting in distortion of the transmitted signals (and potentially additional transceiver circuitry required to compensate for such distortion). Existing alternatives to on-package transmission lines have their own challenges and costs; for example, using an interposer to connect among multiple dies may increase system Z-height and total system cost, while using on-package optical interconnects may require extreme alignment accuracy (and associated assembly challenges, reliability risks and increased cost).

Disclosed herein are waveguide interconnect bridges that may be utilized in IC packages to provide high bandwidth, low loss signaling between different dies or other elements. Such waveguide interconnect bridges may propagate transverse electric (TE) or transverse magnetic (TM) modes of electromagnetic waves, and may achieve good electromagnetic (EM) field confinement and low loss. Various ones of the embodiments disclosed herein may enable communication between two dies with higher bandwidth and reduced (and nearly constant over frequency) insertion loss relative to conventional approaches. Various ones of the embodiments disclosed herein may exhibit reduced cross talk in more tightly spaced channels than conventional approaches. Various ones of the embodiments disclosed herein may support millimeter wave or terahertz signaling, enabling improved communication and performance while enabling very high bandwidth densities.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 2" may be used to refer to the collection of drawings of FIGS. 2A-2B, etc.

FIG. 1 illustrates an example of a waveguide interconnect bridge 100, in accordance with the present disclosure. In particular, FIG. 1A is a cross-sectional view of a waveguide interconnect bridge 100 through the section B-B of FIG. 1B, and FIG. 1B is a cross-sectional view of the waveguide interconnect bridge 100 through the section A-A of FIG. 1A. The same relative views are depicted in FIGS. 2-4 and 5. The waveguide interconnect bridge 100 of FIG. 1 includes a waveguide material 101 and multiple wall cavities 104 in the waveguide material 101. The wall cavities 104 may extend through the waveguide material 101 between a first face 156 and a second face 158 of the waveguide interconnect bridge 100, as shown. The wall cavities 104 may provide walls 111 that define multiple waveguides 102 of the waveguide material 101, extending from a first end 103 of the waveguide interconnect bridge 100 to a second end 105 of the waveguide interconnect bridge 100. In particular, the wall cavities 104 provide walls 111 that separate adjacent ones of the waveguides 102. During use of the waveguide interconnect bridge 100, electromagnetic waves may travel along the waveguides 102 between the first end 103 and the second end 105 (e.g., as discussed below with reference to FIGS. 6-10). Each of the waveguides 102 may thus provide a channel for transmission of an electromagnetic wave along the waveguide interconnect bridge 100. Although the waveguide interconnect bridge 100 of FIG. 1 includes four wall cavities 104 and 5 waveguides 102, this is simply illustrative, and any of the waveguide interconnect bridges 100 disclosed herein may include any desired number of waveguides 102 (e.g., one or more, 5, 10, or 15).

The waveguide material 101 may include any suitable material. A material that may be suitable for the waveguide material 101 may have a dielectric constant that is large enough to achieve effective transmission of electromagnetic waves in a desired frequency range, in conjunction with the relevant dimensions of the waveguide interconnect bridge 100 (e.g., the height 112 and the width 106 of the waveguides 102, as discussed below). In some embodiments, the waveguide material 101 may have a dielectric constant that is greater than 6. In some embodiments, the waveguide material 101 may include a semiconductor material. For example, in some embodiments, the waveguide material 101 may be silicon or germanium. In some embodiments, the waveguide material 101 may be a III-V material, such as gallium arsenide. In some embodiments, the waveguide material 101 may include a plastic (e.g., a plastic having a dielectric constant that is greater than 3, or a plastic having a dielectric constant greater than 6). In some embodiments, one or more metallization layers (not shown) may be formed on the first face 156 and/or the second face 158 of the waveguide interconnect bridge 100; such metallization layers may include any desired circuitry or structures (e.g., the EM wave launching structures 166 discussed below). In some embodiments, the waveguide interconnect bridge 100 may not include any metallization layers.

In the embodiment of FIG. 1, the wall cavities 104 may be filled with air. In other embodiments, the wall cavities 104 may be filled with another fluid or gas, or may be filled with a solid material (e.g., as discussed below with reference to FIG. 5). The material in the wall cavities 104 may have a dielectric constant that is less than the dielectric constant of the waveguide material 101 in order to achieve effective field confinement in the waveguides 102.

The dimensions of the waveguides 102 may take any suitable values to achieve effective transmission of electromagnetic waves in a desired frequency range, in conjunction with the materials of the waveguide interconnect bridge 100. For example, smaller values of the width 106 and or the height 112 of the waveguides 102 may be suitable for transmission of higher frequency electromagnetic waves (and vice versa). In some embodiments, the width 106 of the waveguides 102 may be between 50 micrometers and 1000 micrometers (e.g., between 50 micrometers and 500 micrometers). For example, in some embodiments in which the waveguide material 101 is silicon, the width 106 of the waveguides 102 may be between 40 micrometers and 70 micrometers (e.g., between 50 micrometers and 60 micrometers) for the transmission of electromagnetic signals with a carrier frequency of 1 terahertz, between 70 micrometers and 100 micrometers (e.g., 80 micrometers) for the transmission of electromagnetic signals with a carrier frequency of 900 gigahertz, or between 200 and 300 micrometers (e.g., 250 micrometers) for the transmission of electromagnetic signals with a carrier frequency of 300 gigahertz. In some embodiments, the height 112 of the waveguides 102 may be between 50 micrometers and 1000 micrometers (e.g., between 100 micrometers and 1000 micrometers, or between 50 micrometers and 250 micrometers). For example, in some embodiments in which the waveguide material 101 is silicon, the width 106 of the waveguides 102 may be 250 micrometers and the height 112 of the waveguides 102 may be 125 micrometers; such a waveguide interconnect bridge 100 may be capable of supporting 200 gigabits per second of communication at a carrier frequency of 300 gigahertz with a 100 gigahertz bandwidth when the data is modulated using 16 quadrature amplitude modulation (16 QAM). The distance 108 between adjacent waveguides 102 in a waveguide interconnect bridge 100 may also take any suitable value. In some embodiments, in some embodiments, the distance 108 may be between 20 micrometers and 500 micrometers (e.g., 100 micrometers). For example, in some embodiments in which the waveguide material 101 is silicon, the carrier frequency is 300 gigahertz, and the bandwidth is 100 gigahertz, utilizing a distance 108 of 100 micrometers may allow a bandwidth density of approximately 0.6 terabytes per second per millimeter to be achieved; the bandwidth density may be increased to 1 terabyte per second per millimeter by increasing the carrier frequency and bandwidth. In some embodiments, the length 118 of a section of a wall 111 may be between 100 micrometers and 10 centimeters.

The exterior dimensions of a waveguide interconnect bridge 100 may take any suitable values. For example, in some embodiments, the width 114 of a waveguide interconnect bridge 100 may be between 0.2 millimeters and 5 millimeters. In some embodiments, the length 110 of a waveguide interconnect bridge 100 may be between 1 millimeter and 5 centimeters (e.g., between 5 millimeters and 5 centimeters).

FIGS. 2-5 illustrate additional example waveguide interconnect bridges 100. Any of the features discussed with reference to any of FIGS. 1-5 herein may be combined with any other features to form a waveguide interconnect bridge 100. For example, as discussed further below, FIG. 2 illustrates an embodiment in which the wall cavities 104 have a circular cross-section, and FIG. 5 illustrates an embodiment in which the wall cavities 104 are at least partially filled with a fill material 107. These features of FIGS. 2 and 5 may be combined so that a waveguide interconnect bridge 100, in accordance with the present disclosure, includes wall cavities 104 with a circular cross-section that are at least partially filled with a fill material 107. This particular combination is simply an example, and any combination may be used. A number of elements of FIG. 1 are shared with FIGS. 2-5; for ease of discussion, a description of these elements is not repeated, and these elements may take the form of any of the embodiments disclosed herein.

In the embodiment of FIG. 1, the wall cavities 104 have an elongate cross-section (e.g., a substantially rectangular cross-section, as illustrated in FIG. 1A). More generally, the wall cavities 104 and a waveguide interconnect bridge 100 may have any suitable cross-sectional shape (e.g., as viewed from the "top," as shown in FIG. 1A) and/or arrangement. In other embodiments, the wall cavities 104 may have different cross-sectional shapes and/or arrangements. FIGS. 2-4 illustrate examples of other cross-sectional shapes and arrangements of wall cavities 104 in waveguide interconnect bridges 100. In particular, FIG. 2 illustrates an embodiment in which the wall cavities 104 have circular cross-sections (e.g., as illustrated in FIG. 2A). The wall cavities 104 of FIG. 2 are arranged in groups between adjacent ones of the waveguides 102, with the wall cavities 104 in any particular group being spaced close together in order to provide a wall 111 between the adjacent waveguides 102. The confinement of an electromagnetic wave in a waveguide 102 of the waveguide interconnect bridge 100 of FIG. 2 may depend at least in part on the size and spacing of the wall cavities 104 in the walls 111. Although each wall 111 is shown in FIG. 2 as including two offset "rows" of wall cavities 104, this is simply illustrative, and a wall 111 may include wall cavities 104 arranged in one or more rows of wall cavities 104, a grid or other regular arrangement of wall cavities 104, or in a regular arrangement of wall cavities 104.

FIG. 3 illustrates an embodiment in which the wall cavities 104 have square cross-sections (e.g., as illustrated in FIG. 3A). Like the wall cavities 104 FIG. 2, the wall cavities 104 of FIG. 3 are arranged in groups between adjacent ones of the waveguides 102, with the wall cavities 104 in a particular group being spaced close together in order to provide a wall 111 between the adjacent waveguides 102. The confinement of an electromagnetic wave in a waveguide 102 of the waveguide interconnect bridge 100 of FIG. 3 may depend at least in part on the size and spacing of the wall cavities 104 in the walls 111. Although each wall 111 is shown in FIG. 3 as including two offset "rows" of wall cavities 104, this is simply illustrative, and a wall 111 may include wall cavities 104 arranged in one or more rows of wall cavities 104, a grid or other regular arrangement of wall cavities 104, or in a regular arrangement of wall cavities 104. More generally, the elongated, circular, and square cross-sections of wall cavities 104 illustrated in FIGS. 1-3, respectively, are simply examples, and the wall cavities 104 of the waveguide interconnect bridges 100 disclosed herein may have any suitable shape.

FIG. 4 illustrates an embodiment of a waveguide interconnect bridge 100 in which individual ones of the waveguides 102 have multiple sections of wall cavities 104 along their lengths (e.g., as illustrated in FIG. 4A). In particular, FIG. 4 illustrates an embodiment in which each waveguide 102 has two sections of wall cavities 104 along its length, providing the wall 111. In FIG. 4, the wall cavities 104 have elongated cross-sections (e.g., as discussed above with reference to FIG. 1), but a waveguide interconnect bridge 100 may include walls 111 having multiple sections provided by wall cavities 104 having other cross-sections (e.g., the circular and square cross-sections discussed above with reference to FIGS. 2 and 3). In some embodiments, the distance 120 between adjacent sections of a wall 111 may be between 10 micrometers and 250 micrometers.

As noted above, in some embodiments, the wall cavities 104 of a waveguide interconnect bridge 100 may be filled with air. In other embodiments, the wall cavities 104 of a waveguide interconnect bridge 100 may be filled with other film materials. FIG. 5 illustrates an embodiment in which the wall cavities 104 are filled with a fill material 107 (e.g., a fluid or solid) other than air. As noted above, the fill material 107 may have a dielectric constant that is less than the dielectric constant of the waveguide material 101. For example, in embodiments in which the waveguide material 101 is silicon (with a dielectric constant of approximately 11.9), the fill material 107 may have a dielectric constant that is less than 11.9. In some embodiments, the use of a solid fill material 107 may help provide mechanical stability, and therefore increased reliability, to the waveguide interconnect bridge 100.

Figure 6B:
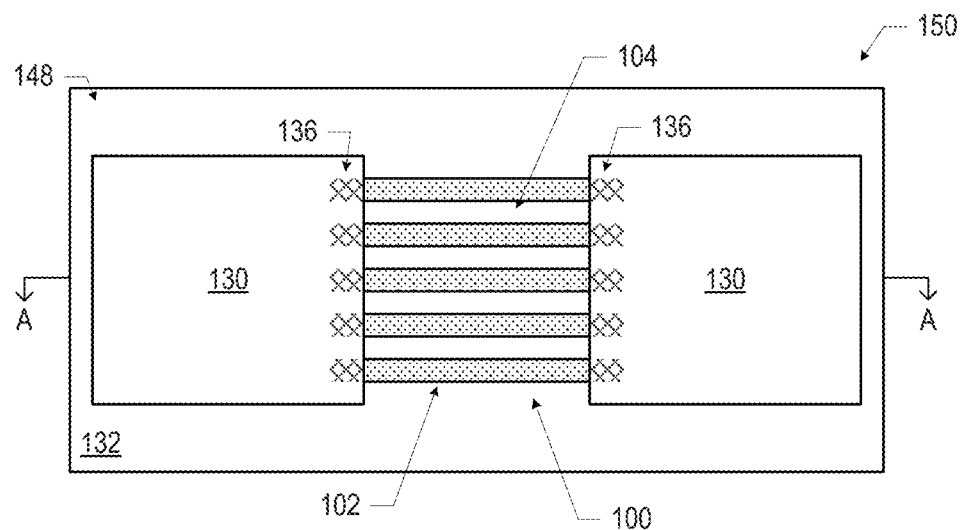

The waveguide interconnect bridges 100 disclosed herein may be used in any suitable IC structures for transmitting electromagnetic energy between other elements. For example, FIG. 6 illustrates a waveguide interconnect bridge package 150 that includes a waveguide interconnect bridge 100 arranged to communicatively couple two dies 130. In particular, FIG. 6A is a side cross-sectional view along the section A-A of FIG. 6B, and FIG. 6B is a top view. In the waveguide interconnect bridge packages 150 disclosed herein, the waveguide interconnect bridge 100 may take the form of any of the embodiments disclosed herein. Moreover, although a single waveguide interconnect bridge 100 is depicted in various ones of the waveguide interconnect bridge packages 150 disclosed herein, this is simply for ease of illustration, and a waveguide interconnect bridge package 150 may include multiple waveguide interconnect bridges 100 to communicatively couple different dies 130 or other elements. The dies 130 may perform any desired functions. For example, in some embodiments, both dies 130 at either end of a waveguide interconnect bridge 100 may be central processing units (e.g., in a server platform). In some embodiments, one die 130 may be a central processing unit and another die 130 may be a memory device. In some embodiments, one or more of the dies 130 may be a field programmable gate array (FPGA). In some embodiments, one or more of the dies 130 may be transceiver dies. In some embodiments, the waveguide interconnect bridge package 150 may be a high-performance computing (HPC) package.

In the waveguide interconnect bridge package 150 of FIG. 6, the waveguide interconnect bridge 100 is disposed on a package substrate 132. The package substrate 132 may include a dielectric material (e.g., one or more organic dielectric materials, or ceramic materials), and may have conductive pathways extending through the dielectric material between the first face 146 and the second face 148, or between different locations on the first face 146, and/or between different locations on the second face 148. These conductive pathways may include conductive vias, conductive lines, and/or other structures know in the art. In some embodiments, most or all of the materials included in the package substrate 132 (e.g., dielectric/organic build-up films, underfill materials, air, etc.) may have a dielectric constant that is less than the dielectric constant of the waveguide material 101, enhancing confinement of electromagnetic waves in the waveguides 102. For example, in some embodiments, most or all of the materials included in the package substrate 132 may have a dielectric constant between 1 and 4.

The package substrate 132 may have conductive contacts 142 at the first face 146 and conductive contacts 140 at the second face 148. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket). The conductive contacts 142 and 140 may be coupled to conductive pathways through the package substrate 132. Second-level interconnects 144 may be coupled to the conductive contacts 142. The second-level interconnects 144 illustrated in FIG. 6 are solder balls (e.g., for a ball grid array arrangement), but any suitable second-level interconnects 144 may be used (e.g., pins in a pin grid array arrangement or lands in a land grid array arrangement). The second-level interconnects 144 may be used to couple the waveguide interconnect bridge package 150 to another component, such as a circuit board (e.g., a motherboard), an interposer, or another IC package, as known in the art and as discussed below with reference to FIG. 14.

Multiple dies 130 may be coupled to the conductive contacts 140 at the second face 148 of the package substrate 132 by first-level interconnects 138. In particular, conductive contacts 134 of the dies 130 may be coupled to conductive contacts 140 of the package substrate 132 by first-level interconnects 138. The first-level interconnects 138 illustrated in FIG. 6 are solder bumps (e.g., controlled collapse chip connection (C4) bumps), but any suitable first-level interconnects 138 may be used (e.g., copper pillars). The dies 130 may each include transceiver circuitry 136. This transceiver circuitry 136 may include suitable circuitry for generating, launching, and/or receiving one or more electromagnetic waves into or from the waveguide interconnect bridge 100 so that these electromagnetic waves may be transmitted along the waveguides 102 to transceiver circuitry 136 of another die 130. Examples of circuitry that may be part of the transceiver circuitry 136 may include analog-to-digital converters, upconversion circuitry, down-conversion circuitry, digital-to-analog converters, EM wave launching structures, antennas, etc. FIG. 6B illustrates different sections of transceiver circuitry 136 associated with each of the different waveguides 102 of the waveguide interconnect bridge 100. In some embodiments, the transceiver circuitry 136 may generate electromagnetic waves having a carrier frequency between 200 gigahertz and 1 terahertz. In some embodiments, the transceiver circuitry 136 may be millimeter wave communications circuitry. In some embodiments, the transceiver circuitry 136 may support communications having a bandwidth that is greater than 100 gigahertz (e.g., supporting the communication of frequencies greater than 50 gigahertz above and below the carrier frequency). The transceiver circuitry 136 may perform any suitable type of modulation, including QAM (e.g., 16 QAM, 32 QAM), binary phase shift keying (BPSK), quadrature phase shift keying (QPSK), other phase shift keying (PSK), amplitude shift keying (ASK), or frequency shift keying (FSK), for example. In some embodiments, the transceiver circuitry 136 may perform non-return-to-zero (NRZ) encoding, or another encoding.

The dies 130 may overlap the waveguide interconnect bridge 100. In particular, one die 130 may overlap the first end 103 of the waveguide interconnect bridge 100 so that a portion of that die 130 extends over the second face 158 of the waveguide interconnect bridge 100, and another die 130 may overlap the second and 105 of the waveguide interconnect bridge 100 so that a portion of that die 130 extends over the second face 158 of the waveguide interconnect bridge 100. In some embodiments, the overlap distance 164 may be greater than or equal to 500 micrometers. The transceiver circuitry 136 of a die 130 may be arranged so that, during operation, the transceiver circuitry 136 may transmit electromagnetic waves into the area of the waveguide interconnect bridge 100 under the die 130 (i.e., in the overlap area) and those waves may propagate in the waveguides 102 along the length 110 of the waveguide interconnect bridge 100; similarly, during operation, the transceiver circuitry 136 may receive electromagnetic waves from the area of the waveguide interconnect bridge 100 under the die 130. In this manner, the waveguide interconnect bridge 100 may serve as a communications bridge between the dies 130, achieving a density and quality of communications that may not be achieved by conventional transmission lines through the package substrate 132. In some embodiments, the lateral distance between the dies 130 may be less than 5 centimeters; the relatively short distance and the properties of the waveguide interconnect bridge 100 may mean that, in some embodiments, no dispersion compensation circuitry may be included in the transceiver circuitry 136. In some embodiments, the dies 130 may include silicon or germanium substrates, or may include III-V material substrates (e.g., indium phosphide, indium gallium arsenide, gallium nitride, etc.). In embodiments in which the dies 130 include silicon or germanium substrates, the transceiver circuitry 136 may include harmonic generation circuitry and frequency multipliers to generate millimeter wave/terahertz carriers; in embodiments in which the dies 130 include III-V material substrates, such circuitry may not be included in the transceiver circuitry 136.

In the embodiment of FIG. 6, the waveguide interconnect bridge 100 is shown as disposed on a substantially flat second face 148 of the package substrate 132. In some embodiments, the waveguide interconnect bridge 100 may not be electrically coupled to any conductive pathways in the package substrate 132. For example, the waveguide interconnect bridge 100 may be secured to the second face 148 of the package substrate 132 by an adhesive (e.g., an epoxy). In another example, the waveguide interconnect bridge 100 may be soldered to the second face 148 of the package substrate 132 (with the solder coupling conductive contacts on the first face 156 of the waveguide interconnect bridge 100 and on the second face 148 of the package substrate 132, not shown), but these solder connections may provide mechanical support, provide shielding, and/or aid in alignment of the waveguide interconnect bridge 100 on the package substrate 132, and may not provide any electrical connections between the waveguide interconnect bridge 100 and electrical pathways within the package substrate 132.

A waveguide interconnect bridge package 150 may include elements other than those shown in FIG. 6. For example, in some embodiments, an underfill material (not shown) may be disposed between the dies 130 and the second face 148 of the package substrate 132 around the first-level interconnects 138. In some embodiments, a mold material (not shown) may be disposed over the dies 130 and the waveguide interconnect bridge 100. Example materials that may be used for the underfill material or mold material may include epoxy materials. A waveguide interconnect bridge package 150 may include additional passive components, such as surface-mount resistors, capacitors, and inductors disposed on the first face 146 or the second face 148 of the package substrate 132. More generally, a waveguide interconnect bridge package 150 may include any other active or passive components known in the art.

Although the waveguide interconnect bridge package 150 illustrated in FIG. 6 is a flip chip package, other package architectures may be used. For example, the waveguide interconnect bridge package 150 may be a ball grid array (BGA) package, such as an embedded wafer-level ball grid array (eWLB) package. In another example, the waveguide interconnect bridge package 150 may be a wafer-level chip scale package (WLCSP) or a panel fanout (FO) package.

Figure 7:
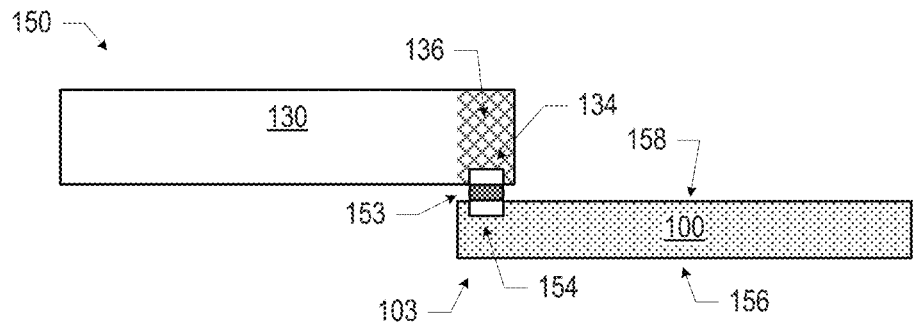

In the embodiment of FIG. 6, the dies 130 are shown as making physical contact with the second face 158 of the waveguide interconnect bridge 100. In other embodiments, the dies 130 may be communicatively coupled to the waveguide interconnect bridge 100 in other ways. For example, FIG. 7 is a side cross-sectional view of a portion of a waveguide interconnect bridge package 150 in which a die 130 is coupled to the waveguide interconnect bridge 100 by solder. In particular, the waveguide interconnect bridge 100 may include one or more conductive contacts 152 at its second face 158, and these conductive contacts 152 may be coupled to conductive contacts 134 of the die 130 by solder 153. In some embodiments, electromagnetic waves generated by the transceiver circuitry 136 of the die 130 may transmit these electromagnetic waves through the solder 153 and into a waveguide 102 of the waveguide interconnect bridge 100; in other words, the solder 153 and the conductive contact 154 may be part of an electrical pathway between the transceiver circuitry 136 and a waveguide 102 of the waveguide interconnect bridge 100. In other embodiments, the waveguide interconnect bridge 100 may be soldered to the die 130 as discussed above, but these solder connections may provide mechanical support, provide shielding, and/or aid in alignment of the waveguide interconnect bridge 100 and the die 130, and may not provide any electrical connections between the waveguide interconnect bridge 100 and the die 130.

Figure 8:
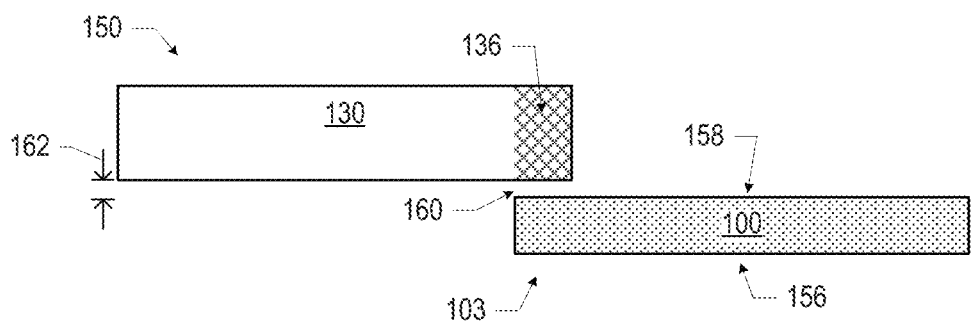

FIG. 8 is a side, cross-sectional view of a portion of a waveguide interconnect bridge package 150 in which a gap 160 is present between the die 130 and the second face 158 of the waveguide interconnect bridge 100. In some embodiments, this gap 160 may be filled with air, while in other embodiments, this gap 160 may be filled with an adhesive, an underfill material, a mold material, or any other suitable non-conductive material (not shown). In some embodiments, the thickness 162 of this gap 160 may be less than 10 micrometers (e.g., between 1 micrometer and 10 micrometers). At high frequencies of communication, the waveguide interconnect bridge package 150 may achieve successful communication between the dies 130 via the waveguide interconnect bridge 100 even when a gap 160 is present. Generally, the waveguide interconnect bridge packages 150 disclosed herein may have assembly advantages over conventional packages, or alternative on-package optical interconnects, at least because such gaps 160 (as well as misalignment in the X-Y direction) may be tolerated without compromising performance.

Figure 9:
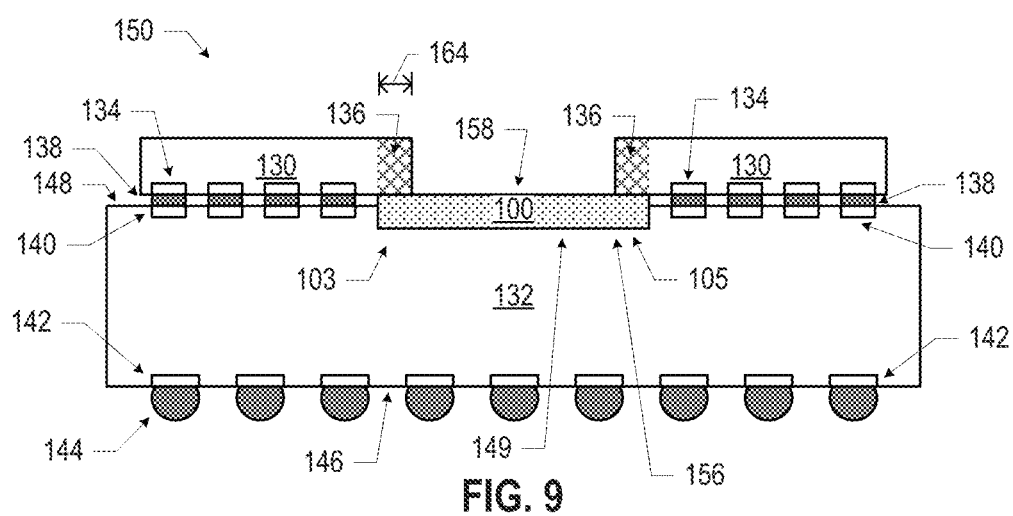
Figure 10:
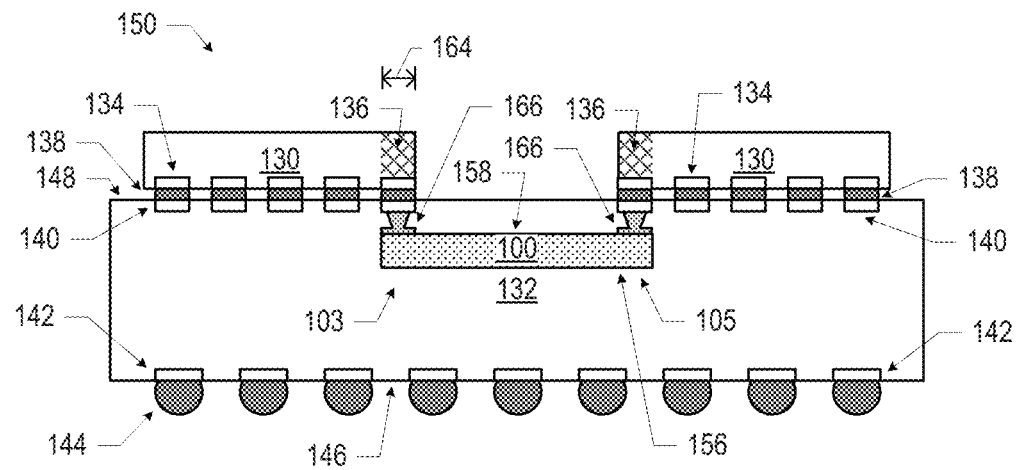

FIGS. 9-10 illustrate additional example waveguide interconnect bridge packages 150. Any of the features discussed with reference to any of FIGS. 6-8 herein may be combined with any other features to form a waveguide interconnect bridge package 150. For example, as discussed further below, FIG. 9 illustrates an embodiment in which the waveguide interconnect bridge 100 is disposed in a recess in a package substrate 132. The features of FIGS. 8 and 9 may be combined so that a waveguide interconnect bridge 100, in accordance with the present disclosure, is disposed in a recess in a package substrate 132 and is spaced away from an overlapping die 130 by a gap 160. This particular combination is simply an example, and any combination may be used. A number of elements of FIG. 6 are shared with FIGS. 9-10; for ease of discussion, a description of these elements is not repeated, and these elements may take the form of any of the embodiments disclosed herein.

FIG. 9 illustrates an embodiment of a waveguide interconnect bridge package 150 in which the package substrate 132 includes a recess 149 in the second face 148, and the waveguide interconnect bridge 100 is at least partially disposed in the recess 149. As discussed above with reference to FIG. 6, multiple dies 130 may be coupled to the conductive contacts 140 at the second face 148 of the package substrate 132 by first-level interconnects 138. Transceiver circuitry 136 of the dies 130 may include suitable circuitry for generating, launching, and/or receiving one or more electromagnetic waves into or from the waveguide interconnect bridge 100 so that these electromagnetic waves may be transmitted along the waveguides 102 to transceiver circuitry 136 of another die 130. A top view of the waveguide interconnect bridge package 150 of FIG. 9 may take the form illustrated in FIG. 6B.

In some embodiments, the waveguide interconnect bridge 100 may be disposed in the recess 149 without being secured by an adhesive or other mechanism. In other embodiments, the waveguide interconnect bridge 100 may be secured in the recess 149 by an adhesive or by solder connections (not shown). In some embodiments in which the waveguide interconnect bridge 100 secured in the recess 149 by solder connections, these solder connections may provide mechanical support and may aid in alignment of the waveguide interconnect bridge 100 on the package substrate 132, and may not provide any electrical connections between the waveguide interconnect bridge 100 and electrical pathways within the package substrate 132. The interface between the dies 130 and the waveguide interconnect bridge 100 may take any of the forms discussed herein (e.g., direct physical contact, an adhesive, solder, air gap, etc.).

FIG. 10 illustrates an embodiment of a waveguide interconnect bridge package 150 in which the waveguide interconnect bridge 100 is embedded in the package substrate 132. In particular, a portion of the package substrate 132 is between the first face 156 of the waveguide interconnect bridge 100 and the first face 146 of the package substrate 132, and a portion of the package substrate 132 is between the second face 158 of the waveguide interconnect bridge 100 and the second face 148 of the package substrate 132. The waveguide interconnect bridge package 150 of FIG. 10 also includes EM wave launching structures 166 between the dies 130 and the waveguide interconnect bridge 100; in particular, one EM wave launching structure 166 is proximate to the first end 103 and between the first end 103 and one die 130, and another EM wave launching structure 166 is proximate to the second end 105 and between the second end 105 and another die 130. During operation, a die 130 may generate an electromagnetic signal to be transmitted along a waveguide 102 of the waveguide interconnect bridge 100, and transceiver circuitry 136 of the die 130 may transmit that electromagnetic signal to the proximate EM wave launching structure 166; the EM wave launching structure 166 may radiate this electromagnetic signal into the proximate end of the waveguide interconnect bridge 100 so that the electromagnetic signal propagates along a waveguide 102. Further, during operation, an electromagnetic signal may propagate along a waveguide 102 and may be received by a EM wave launching structure 166; that EM wave launching structure 166 may radiate the electromagnetic signal to the proximate transceiver circuitry 136 of a die 130. In some embodiments, a die 130 may be electrically coupled to a proximate EM wave launching structure 166 by a solder connection (e.g., as illustrated in FIG. 10). The EM wave launching structures 166 may be resonant or non-resonant radio frequency (RF) structures, and may include any EM wave launching structures known in the art (e.g., microstrip-to-slot transition launchers, leaky travelling wave launchers, in-package tapered-horn launchers, etc.). In some embodiments, the EM wave launching structures 166 may be formed of conductive vias and lines in the package substrate 132. Including EM wave launching structures 166 in the package substrate 132 may result in lower overall insertion loss and lower cost relative to embodiments in which the EM wave launching structures are included in the dies 130.

In some embodiments, an EM wave launching structure 166 may be partially or entirely included in a waveguide interconnect bridge 100. In particular, the waveguide interconnect bridge 100 may include one or more layers of metallization (on the first face 156 and/or the second face 158, not shown), and an EM wave launching structure 166 may be partially or entirely included in that metallization. In some embodiments, an EM wave launching structure 166 may be partially or entirely included in a waveguide interconnect bridge 100 only in the area of the waveguide interconnect bridge 100 that will overlap with a die 130; in other embodiments, an EM wave launching structure may be partially or entirely included in areas of the waveguide interconnect bridge 100 outside of the overlap region. In some embodiments in which an EM wave launching structure 166 is partially included in a waveguide interconnect bridge 100, the remainder of the EM wave launching structure 166 may be included in the package substrate 132. In other embodiments in which an EM wave launching structure 166 is partially included in a waveguide interconnect bridge 100, the remainder of the EM wave launching structure 166 may be included in a die 130. In some embodiments, the waveguide interconnect bridge 100 may include no metallization layers.

Figure 11:
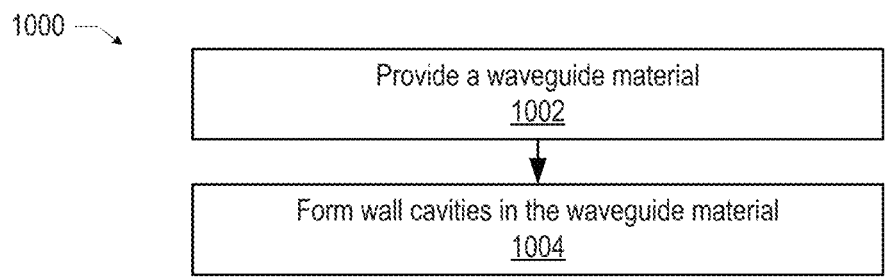
FIG. 11 is a flow diagram of a method of manufacturing a waveguide interconnect bridge, in accordance with various embodiments.

FIG. 11 is a flow diagram of a method 1000 of manufacturing a waveguide interconnect bridge 100, in accordance with various embodiments. Although the operations of the method 1000 may be illustrated with reference to particular embodiments of the waveguide interconnect bridges 100 disclosed herein, the method 1000 may be used to form any suitable waveguide interconnect bridges. Operations are illustrated once each and in a particular order in FIG. 11, but the operations may be reordered and/or repeated as desired (e.g., with different operations performed in parallel when manufacturing multiple waveguide interconnect bridges simultaneously).

At 1002, a waveguide material may be provided. For example, a waveguide material 101 may be provided. In some embodiments, providing a waveguide material may include forming a base structure by thinning an initial material to a desired thickness (e.g., thinning a semiconductor wafer to a desired height 112).

At 1004, wall cavities may be formed in the waveguide material. For example, one or more wall cavities 104 may be formed in the waveguide material 101 (e.g., by mechanical drilling, laser drilling, wet etching, reactive ion etching (RIE), etc.). In some embodiments, multiple waveguide interconnect bridges 100 may be formed simultaneously in a single piece of material (e.g., a single finned semiconductor wafer), and the multiple waveguide interconnect bridges 100 may then be separated from each other by singulation. In some embodiments, the method 100 may further include filling the wall cavities with a fill material (e.g., a fill material having a dielectric constant higher than the dielectric constant of the waveguide material). In some embodiments, the method 1000 may further include forming one or more metallization layers on the waveguide material.

The waveguide interconnect bridges 100, and waveguide interconnect bridge packages 150, disclosed herein may be included in any suitable electronic component. FIGS. 12-15 illustrate various examples of structures that may be used with or include any of the waveguide interconnect bridges 100, or waveguide interconnect bridge packages 150, disclosed herein.

Figure 12:
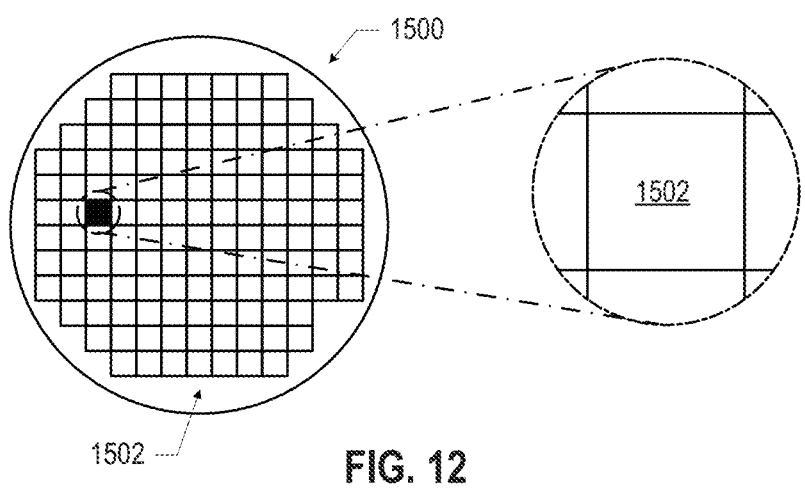
FIG. 12 is a top view of a wafer and dies that may be communicatively coupled by a waveguide interconnect bridge, in accordance with any of the embodiments disclosed herein.

FIG. 12 is a top view of a wafer 1500 and dies 1502 that may be included in an IC package along with one or waveguide interconnect bridges 100 (e.g., as discussed above with reference to FIGS. 6-10) in accordance with any of the embodiments disclosed herein. For example, any of the dies 1502 may serve as a die 130 in a waveguide interconnect bridge package 150. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 13, discussed below) and/or supporting circuitry to route electrical signals to the transistors, as well as any other IC components. As discussed above, a die 1502 may include transceiver circuitry 136. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 15) or other logic that is configured to store information in the memory devices or execute instructions stored in the memory array.

Figure 13:
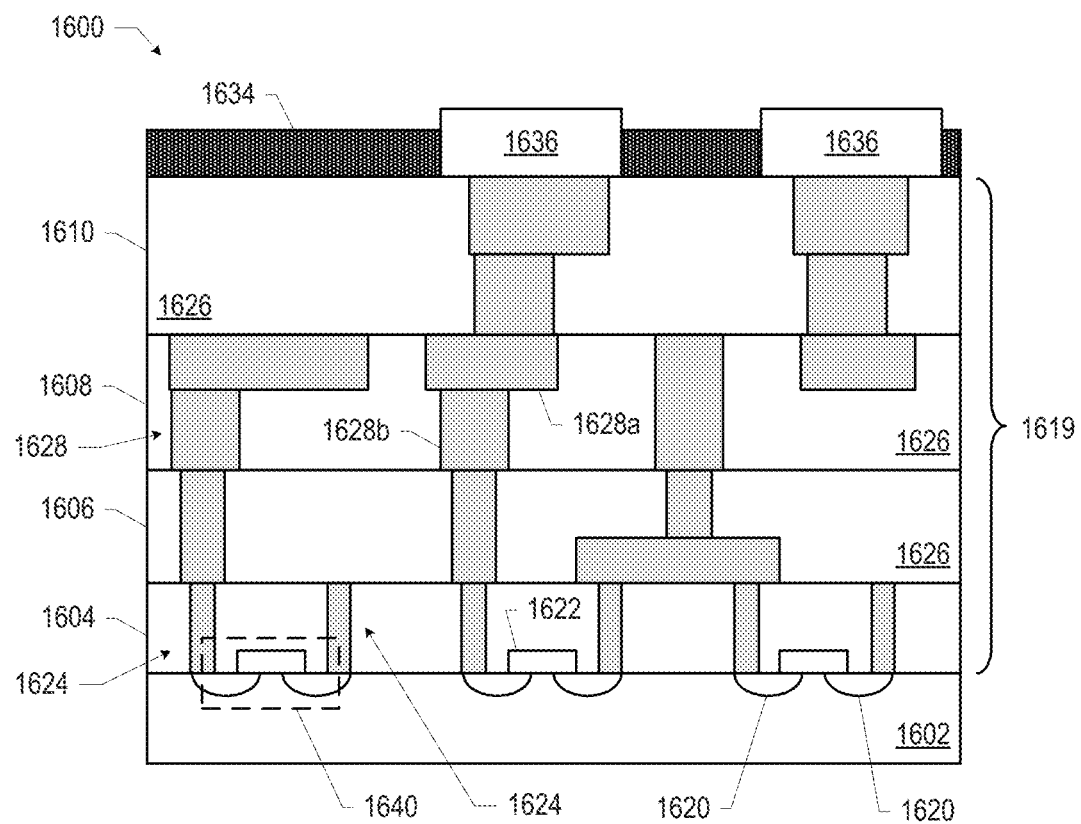
FIG. 13 is a cross-sectional side view of an integrated circuit (IC) device that may be included in a die that communicates with another die via a waveguide interconnect bridge, in accordance with any of the embodiments disclosed herein.

FIG. 13 is a cross-sectional side view of an IC device 1600 that may communicatively couple with another die via a waveguide interconnect bridge 100, or may be included in a waveguide interconnect bridge package 150, in accordance with any of the embodiments disclosed herein. One or more of the IC devices 1600 may be included in one or more dies 1502 (FIG. 12). The IC device 1600 may be formed on a substrate 1602 (e.g., the wafer 1500 of FIG. 12) and may be included in a die (e.g., the die 1502 of FIG. 12). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 12) or a wafer (e.g., the wafer 1500 of FIG. 12).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 13 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 13 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 13). Although a particular number of interconnect layers 1606-1610 is depicted in FIG. 13, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 13. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 13. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 13, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 14:
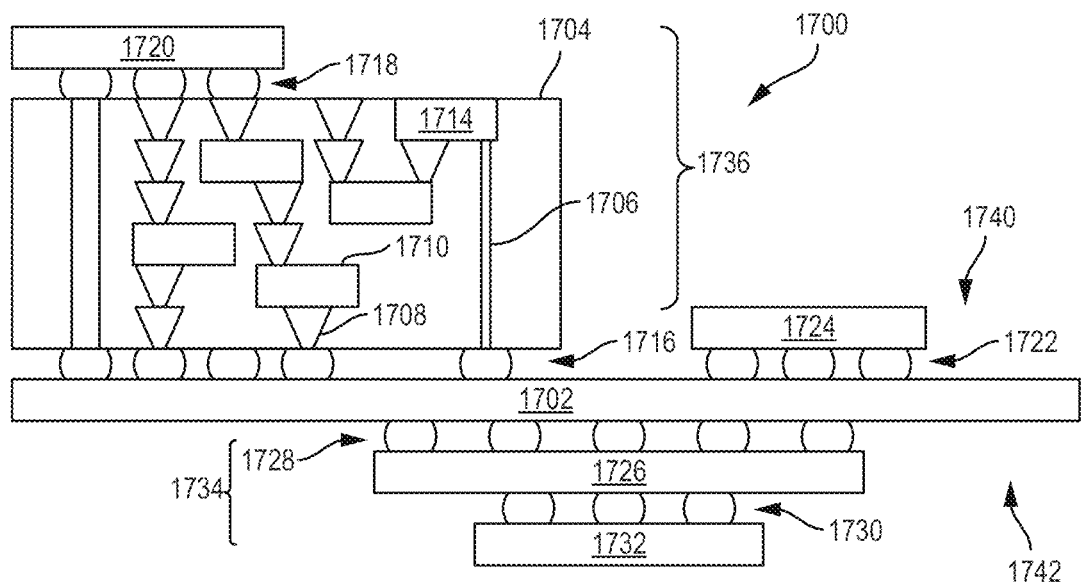
FIG. 14 is a cross-sectional side view of an IC device assembly that may include a waveguide interconnect bridge, in accordance with any of the embodiments disclosed herein.

FIG. 14 is a cross-sectional side view of an IC device assembly 1700 that may include one or more waveguide interconnect bridges 100, or waveguide interconnect bridge packages 150, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the waveguide interconnect bridge package 150 discussed above with reference to FIGS. 6-10 (e.g., may include one or more waveguide interconnect bridges 100).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 14 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 14), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 14, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 12), an IC device (e.g., the IC device 1600 of FIG. 13), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 14, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more waveguide interconnect bridges 100.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 14 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 15:
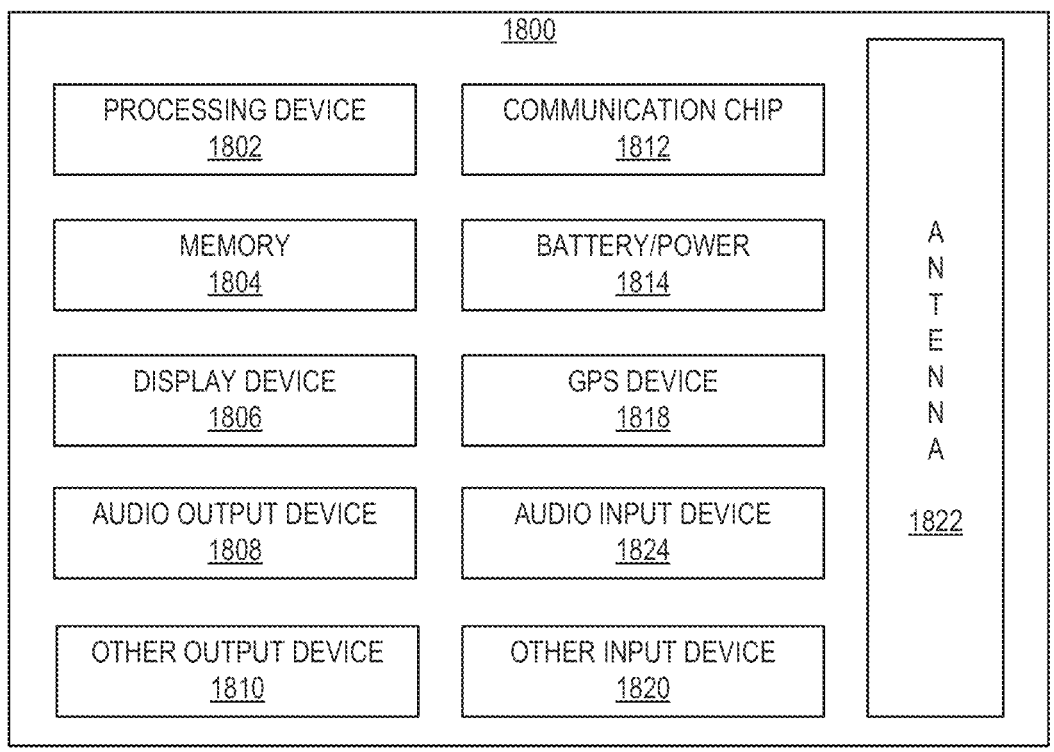
FIG. 15 is a block diagram of an example computing device that may include a waveguide interconnect bridge, in accordance with any of the embodiments disclosed herein.

FIG. 15 is a block diagram of an example computing device 1800 that may include one or more waveguide interconnect bridges 100, or waveguide interconnect bridge packages 150, in accordance with any of the embodiments disclosed herein. For example, any suitable ones of the components of the computing device 1800 may include one or more of the waveguide interconnect bridges 100, waveguide interconnect bridge packages 150, IC device assemblies 1700, IC devices 1600, or dies 1502 disclosed herein.

A number of components are illustrated in FIG. 15 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 15, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808, but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The computing device 1800 may include an audio output device 1808 (or corresponding interface circuitry, as discussed above). The audio output device 1808 may include any device that generates an audible indicator, such as speakers, headsets, or earbuds.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the computing device 1800 may be any other electronic device that processes data.

The following paragraphs provide various examples of the embodiments disclosed herein.

Example 1 is a waveguide interconnect bridge, including: a waveguide material; and one or more wall cavities in the waveguide material.

Example 2 may include the subject matter of Example 1, and may further specify that the waveguide material includes a semiconductor material.

Example 3 may include the subject matter of Example 1, and may further specify that the waveguide material includes silicon or germanium.

Example 4 may include the subject matter of Example 1, and may further specify that the waveguide material includes a III-V material.

Example 5 may include the subject matter of any of Examples 1-4, and may further specify that the waveguide material includes a plastic.

Example 6 may include the subject matter of any of Examples 1-5, and may further specify that the one or more wall cavities define multiple waveguides in the waveguide interconnect bridge.

Example 7 may include the subject matter of Example 6, and may further specify that individual ones of the waveguides have a width between 50 micrometers and 500 micrometers.

Example 8 may include the subject matter of any of Examples 6-7, and may further specify that individual ones of the waveguides have a height between 40 micrometers and 250 micrometers.

Example 9 may include the subject matter of any of Examples 6-8, and may further specify that individual ones of the waveguides have a length between 1 millimeter and 5 centimeters.

Example 10 may include the subject matter of any of Examples 6-9, and may further specify that an individual waveguide has multiple wall cavities along its length.

Example 11 may include the subject matter of any of Examples 1-10, and may further specify that the one or more wall cavities have an elongate cross-section.

Example 12 may include the subject matter of any of Examples 1-10, and may further specify that the one or more wall cavities have a circular cross-section.

Example 13 may include the subject matter of any of Examples 1-10, and may further specify that the one or more wall cavities have a rectangular cross-section.

Example 14 may include the subject matter of any of Examples 1-13, and may further specify that the one or more wall cavities are at least partially filled with a solid fill material.

Example 15 may include the subject matter of Example 14, and may further specify that the solid fill material includes a plastic.

Example 16 may include the subject matter of any of Examples 14-15, and may further specify that the solid fill material has a dielectric constant below a dielectric constant of the waveguide material.

Example 17 may include the subject matter of any of Examples 1-16, and may further specify that the one or more wall cavities are at least partially filled with a fluid fill material.

Example 18 may include the subject matter of any of Examples 1-17, and may further specify that the one or more wall cavities are at least partially filled with air.

Example 19 is an integrated circuit (IC) structure, including: a waveguide interconnect bridge; and a package substrate; wherein the waveguide interconnect bridge is in or on the package substrate.

Example 20 may include the subject matter of Example 19, and may further specify that the waveguide interconnect bridge is at least partially in a recess of the package substrate.

Example 21 may include the subject matter of Example 19, and may further specify that the waveguide interconnect bridge is embedded in the package substrate.

Example 22 may include the subject matter of any of Examples 19-21, and may further include: a first electromagnetic (EM) wave launching structure in the package substrate proximate to a first end of the waveguide interconnect bridge; and a second EM wave launching structure in the package substrate proximate to a second end of the waveguide interconnect bridge, wherein the first end of the waveguide interconnect bridge is opposite to the second end of the waveguide interconnect bridge.

Example 23 may include the subject matter of any of Examples 19-22, and may further specify that the package substrate includes an organic material.

Example 24 may include the subject matter of any of Examples 19-23, and may further include: a first die coupled to the package substrate; and a second die coupled to the package substrate; wherein the first die overlaps the waveguide interconnect bridge, and the second die overlaps the waveguide interconnect bridge.

Example 25 may include the subject matter of Example 24, and may further specify that the first die is in physical contact with the waveguide interconnect bridge.

Example 26 may include the subject matter of Example 24, and may further specify that the first die is not in physical contact with the waveguide interconnect bridge.

Example 27 may include the subject matter of Example 26, and may further specify that a gap is between the first die and the waveguide interconnect bridge.

Example 28 may include the subject matter of Example 24, and may further specify that the first die is coupled to the waveguide interconnect bridge by solder or an adhesive.

Example 29 may include the subject matter of any of Examples 24-28, and may further specify that the first die overlaps the waveguide interconnect bridge by a distance less than 600 micrometers.

Example 30 may include the subject matter of Example 24, and may further specify that the first die is coupled to the package substrate by solder.

Example 31 may include the subject matter of any of Examples 24-30, and may further specify that the waveguide interconnect bridge provides one or more waveguides for communication between the first die and the second die.

Example 32 may include the subject matter of any of Examples 24-31, and may further specify that the first die includes a first electromagnetic (EM) wave launching structure proximate to a first end of the waveguide interconnect bridge, the second die includes a second EM wave launching structure proximate to a second end of the waveguide interconnect bridge, and the first end of the waveguide interconnect bridge is opposite to the second end of the waveguide interconnect bridge.

Example 33 may include the subject matter of any of Examples 24-32, and may further specify that the first die and the second die include a transceiver circuitry with a bandwidth greater than 100 gigahertz.

Example 34 may include the subject matter of any of Examples 24-33, and may further specify that the first die is a central processing unit and the second die is a memory device.

Example 35 may include the subject matter of any of Examples 19-34, and may further specify that the waveguide interconnect bridge is as described in any of Examples 1-17.

Example 36 is a method of manufacturing a waveguide interconnect bridge, including: forming a base structure of a waveguide material; and forming one or more wall cavities in the base structure.

Example 37 may include the subject matter of Example 36, wherein the waveguide material includes a semiconductor material.

Example 38 may include the subject matter of Example 36, wherein the waveguide material includes silicon or germanium.

Example 39 may include the subject matter of Example 36, wherein the waveguide material includes a III-V material.

Example 40 may include the subject matter of any of Examples 36-39, wherein the waveguide material includes a plastic.

Example 41 may include the subject matter of any of Examples 36-40, and may further specify that the one or more wall cavities define one or more waveguides having a width between 50 micrometers and 500 micrometers.

Example 42 may include the subject matter of any of Examples 36-41, and may further specify that the one or more wall cavities define one or more waveguides having a height between 40 micrometers and 250 micrometers.

Example 43 may include the subject matter of any of Examples 36-42, and may further specify that the one or more wall cavities define one or more waveguides having a length between 5 millimeters and 5 centimeters.

Example 44 may include the subject matter of any of Examples 36-43, and may further specify that forming the one or more wall cavities includes drilling the one or more wall cavities.

Example 45 may include the subject matter of any of Examples 36-44, and may further specify that forming the one or more wall cavities includes etching the one or more wall cavities.

Example 46 may include the subject matter of any of Examples 36-45, and may further include: providing a fill material in the one or more wall cavities.

Example 47 may include the subject matter of Example 46, and may further specify that the fill material has a dielectric constant below a dielectric constant of the waveguide material.

Example 48 may include the subject matter of any of Examples 46-47, and may further specify that the fill material includes a plastic.

Example 49 is a computing device, including: a package substrate; a first die coupled to the package substrate by solder; a second die coupled to the package substrate by solder; and a waveguide interconnect bridge, wherein the first die is spaced apart from the waveguide interconnect bridge by a distance less than 10 micrometers, and the second die is spaced apart from the waveguide interconnect bridge by a distance less than 10 micrometers.

Example 50 may include the subject matter of Example 49, and may further specify that the first die overlaps the waveguide interconnect bridge, and the second die overlaps the waveguide interconnect bridge.

Example 51 may include the subject matter of any of Examples 49-50, and may further specify that the first die is in physical contact with the waveguide interconnect bridge.

Example 52 may include the subject matter of any of Examples 49-50, and may further specify that the first die is not in physical contact with the waveguide interconnect bridge.

Example 53 may include the subject matter of Example 52, and may further specify that an air gap is between the first die and the waveguide interconnect bridge.

Example 54 may include the subject matter of Example 49, and may further specify that the first die is coupled to the waveguide interconnect bridge by solder or an adhesive.

Example 55 may include the subject matter of any of Examples 49-54, and may further specify that the waveguide interconnect bridge includes a waveguide material and one or more wall cavities in the waveguide material.

Example 56 may include the subject matter of Example 55, and may further specify that the waveguide material includes a semiconductor material.

Example 57 may include the subject matter of Example 55, and may further specify that the waveguide material includes silicon or germanium.

Example 58 may include the subject matter of Example 55, and may further specify that the waveguide material includes a III-V material.

Example 59 may include the subject matter of any of Examples 55-58, and may further specify that the waveguide material includes a plastic.

Example 60 may include the subject matter of any of Examples 55-59, and may further specify that the one or more wall cavities define multiple waveguides in the waveguide interconnect bridge.

Example 61 may include the subject matter of Example 60, and may further specify that individual ones of the waveguides have a width between 50 micrometers and 500 micrometers.

Example 62 may include the subject matter of any of Examples 60-61, and may further specify that individual ones of the waveguides have a height between 40 micrometers and 250 micrometers.

Example 63 may include the subject matter of any of Examples 60-62, and may further specify that individual ones of the waveguides have a length between 5 millimeters and 5 centimeters.

Example 64 may include the subject matter of any of Examples 60-63, and may further specify that an individual waveguide has multiple wall cavities along its length.

Example 65 may include the subject matter of any of Examples 49-54, and may further specify that the waveguide interconnect bridge is as described in any of Examples 1-18.

Example 66 may include the subject matter of any of Examples 1-65, and may further specify that the waveguide interconnect bridge includes at least a portion of an electromagnetic wave launching structure.

Example 67 may include the subject matter of any of Examples 1-66, and may further specify that the waveguide interconnect bridge includes at least one metallization layer.

The invention claimed is:

1. A waveguide interconnect bridge, comprising:
   a waveguide material; and
   one or more wall cavities in the waveguide material, the one or more wall cavities defining a plurality of waveguides in the waveguide interconnect bridge, the plurality of waveguides extending from a first end of the waveguide interconnect bridge to a second end of the waveguide interconnect bridge, and the waveguide material laterally surrounding the one or more wall cavities.

2. The waveguide interconnect bridge of claim 1, wherein the waveguide material includes a semiconductor material.

3. The waveguide interconnect bridge of claim 1, wherein the waveguide material includes a plastic.

4. The waveguide interconnect bridge of claim 1, further comprising: one or more metallization layers.

5. The waveguide interconnect bridge of claim 1, wherein individual ones of the waveguides have a width between 50 micrometers and 500 micrometers, or a height between 40 micrometers and 250 micrometers, or a length between 1 millimeter and 5 centimeters.

6. The waveguide interconnect bridge of claim 1, wherein the one or more wall cavities are at least partially filled with a solid fill material.

7. The waveguide interconnect bridge of claim 1, wherein the one or more wall cavities are at least partially filled with air.

8. A method of manufacturing a waveguide interconnect bridge, comprising:
   forming a base structure of a waveguide material; and
   forming one or more wall cavities in the base structure, the one or more wall cavities defining a plurality of waveguides in the waveguide interconnect bridge, the plurality of waveguides extending from a first end of the waveguide interconnect bridge to a second end of the waveguide interconnect bridge, and the waveguide material laterally surrounding the one or more wall cavities.

9. The method of claim 8, wherein forming the one or more wall cavities includes drilling the one or more wall cavities.

10. The method of claim 8, wherein forming the one or more wall cavities includes etching the one or more wall cavities.

11. The method of claim 8, further comprising:
    providing a fill material in the one or more wall cavities.

12. A waveguide interconnect bridge, comprising:
    a waveguide material; and one or more wall cavities in the waveguide material, wherein the one or more wall cavities define multiple waveguides in the waveguide interconnect bridge, the waveguide material laterally surrounding the one or more wall cavities, wherein individual ones of the waveguides have a width between 50 micrometers and 500 micrometers, or a height between 40 micrometers and 250 micrometers, or a length between 1 millimeter and 5 centimeters.

13. The waveguide interconnect bridge of claim 12, wherein the waveguide material includes a semiconductor material.

14. The waveguide interconnect bridge of claim 12, wherein the waveguide material includes a plastic.

15. The waveguide interconnect bridge of claim 12, wherein the one or more wall cavities are at least partially filled with a solid fill material.

16. The waveguide interconnect bridge of claim 12, wherein the one or more wall cavities are at least partially filled with air.

17. The waveguide interconnect bridge of claim 12, further comprising: one or more metallization layers.

\* \* \* \* \*